United States Patent [19]
Fazan et al.

[11] Patent Number: 5,597,756
[45] Date of Patent: Jan. 28, 1997

[54] PROCESS FOR FABRICATING A CUP-SHAPED DRAM CAPACITOR USING A MULTI-LAYER PARTLY-SACRIFICIAL STACK

[75] Inventors: Pierre C. Fazan; Thomas A. Figura, both of Boise, Id.

[73] Assignee: Micron Technology, Inc., Boise, Id.

[21] Appl. No.: 493,139

[22] Filed: Jun. 21, 1995

[51] Int. Cl.⁶ .............................. H01L 21/70; H01L 27/00
[52] U.S. Cl. .................. 437/52; 437/60; 437/919
[58] Field of Search .................. 437/47–48, 60, 437/919, 52

[56] References Cited

U.S. PATENT DOCUMENTS

| | | | |
|---|---|---|---|
| 5,162,248 | 11/1992 | Dennison et al. | 437/52 |
| 5,168,073 | 12/1992 | Gonzalez et al. | 437/47 |
| 5,292,677 | 3/1994 | Dennison | 437/52 |
| 5,338,700 | 8/1994 | Dennison et al. | 437/60 |
| 5,354,705 | 10/1994 | Mathews et al. | 437/52 |
| 5,447,878 | 9/1995 | Park et al. | 437/52 |

*Primary Examiner*—H. Jey Tsai
*Attorney, Agent, or Firm*—Angus C. Fox, III

[57] ABSTRACT

This invention is a process for fabricating a dynamic random access memory (DRAM) having a stacked capacitor with hemispherical-grain (HSG) polysilicon asperities on an amorphous silicon storage-node plate. The process enables the selective formation of HSG polysilicon asperities on the storage-node plates and a subsequent deposition of a high-quality silicon nitride cell dielectric layer on the asperity-covered storage-node plates. The process is preferably initiated following field oxide formation, wordline formation, access transistor source/drain region formation, deposition of a planarizing dielectric layer, formation of bitline contact and storage-node contact openings in the planarizing layer, and formation of conductive plugs in both types of contact openings. The process is implemented by sequentially depositing a first tetraethylorthosilicate (TEOS) oxide layer, a first silicon nitride layer, a second TEOS oxide layer, a second silicon nitride layer, and a boro-phospho-silicate glass (BPSG) layer to form a multi-layer partly-sacrificial stack. Depressions are etched in the partly-sacrificial stack and amorphous silicon cup-shaped storage-node plates are formed in the depressions. Following removal of the BPSG layer and the second silicon nitride layer, HSG polysilicon asperities are formed on the plates. The second TEOS oxide layer is then removed, exposing the first silicon nitride layer. A silicon nitride cell dielectric layer is then deposited over the surface of the array.

29 Claims, 4 Drawing Sheets

5,597,756

PROCESS FOR FABRICATING A CUP-SHAPED DRAM CAPACITOR USING A MULTI-LAYER PARTLY-SACRIFICIAL STACK

FIELD OF THE INVENTION

This invention relates to semiconductor integrated circuit manufacture and, more particularly, to a process for fabricating a cup-shaped DRAM capacitor using a multi-layer partly-sacrificial stack.

BACKGROUND OF THE INVENTION

The business of producing dynamic random access memory (DRAM) devices is a very competitive, high-volume business. Process efficiency and manufacturability, as well as product quality, reliability, and performance are the key factors that determine the economic success of such a venture.

Each cell within a DRAM device, an individually-addressable location for storing a single bit of digital data, is comprised of two main components: a field-effect access transistor and a capacitor. Each new generation of DRAM devices generally has an integration level that is four times that of the generation which it replaced. Such a quadrupling of device number per chip is always accompanied by a decrease in device geometries, and often by a decrease in operating voltages. As device geometries and operating voltages are decreased, the DRAM designer is faced with the difficult task of maintaining cell capacitance at an acceptable level. This must be accomplished without resorting to processes that reduce product yield or that markedly increase the number of masking and deposition steps in the production process. All DRAM memories of 4-megabit and greater density utilize cell designs having three-dimensional capacitors. Although both trench and stacked capacitor designs have proven serviceable at the 4-megabit level, most manufacturers now seem to favor the stacked capacitor design for its manufacturability and somewhat higher yield.

In order to increase the capacitance of a DRAM memory cell capacitor, it has been determined to be advantageous to form a rough surface on the storage-node capacitor plates. One of the most successful techniques for creating a rough surface is the growth of hemispherical-grain (HSG) polycrystalline silicon (polysilicon) nodules or asperities on the surface on the surfaces of the storage-node plates. Although HSG polysilicon can be deposited via chemical vapor deposition, a selective-growth process using vacuum anneal is simpler and, thus, preferred. In order to prevent the shorting together of all the storage-node plates in the memory array, the growth of the HSG polysilicon asperities must be selective. In addition, experiments have shown that when a silicon dioxide layer is present at the edge of a storage node plate, deposition of a silicon nitride dielectric layer on the storage-node plate will be thinner near that edge, and will result in a current leakage path unless the thickness of the dielectric layer is increased, resulting in decreased capacitance for the same unit area. Thus it is preferable to deposit a silicon nitride dielectric layer on a silicon surface when an existing silicon nitride film is present at the edges of the surface. What is needed is a process flow for fabricating DRAM capacitors that addresses these issues.

SUMMARY OF THE INVENTION

This invention is a process for fabricating a dynamic random access memory (DRAM) having a stacked capacitor with hemispherical-grain (HSG) polycrystalline silicon asperities formed on an amorphous silicon storage-node plate. The process is advantageous because at the time when the asperities are selectively grown on the storage-node plates, a silicon dioxide layer covers all features of the array except for the amorphous silicon storage-node plates on which have been grown HSG polysilicon. This eliminates the problem of all storage-node plates being shorted together by deposited HSG polysilicon. Likewise, when the cell dielectric layer is subsequently deposited, a layer of silicon nitride layer is present at the edges of the storage-node plate surfaces where silicon nitride is to be deposited. This feature of the process eliminates the non-uniformity of thickness that accompanies silicon nitride deposition on silicon that is not bounded by silicon nitride. Thus, the present invention provides a process sequence which facilitates the growth of HSG polysilicon only on the storage-node plates and the subsequent deposition of a uniformly-thick silicon nitride over the asperity-covered storage-node plates.

In a preferred embodiment of the invention, the process is implemented by sequentially depositing a first tetraethylorthosilicate (TEOS) oxide layer, a first silicon nitride layer, a second TEOS oxide layer, a second silicon nitride layer, and a borophosphosilicate glass (BPSG) layer to form a multi-layer partly-sacrificial stack. Depressions are etched through all five layers of the partly-sacrificial stack and amorphous silicon cup-shaped storage-node plates are formed in the depressions. Following removal of the BPSG layer and the second silicon nitride layer, HSG polysilicon is grown on the plates. The second TEOS oxide layer is then removed, exposing the first silicon nitride layer. A silicon nitride cell dielectric layer is then deposited over the surface of the array. The process is preferably begun at an array processing stage which follows field oxide formation, wordline formation, access transistor source/drain region formation, deposition of a planarizing dielectric layer, bitline contact and storage-node contact opening formation, and formation of conductive plugs in both types of contact openings.

ADVANTAGES OF THE INVENTION

This invention is a process for fabricating a dynamic random access memory (DRAM) having a stacked capacitor with hemispherical-grain (HSG) polycrystalline silicon asperities grown on an amorphous silicon storage-node plate. The process provides a silicon dioxide layer which covers all features of the array except the amorphous silicon storage-node plates during the time when HSG polysilicon asperities are grown on the plates. This eliminates the problem of all storage-node plates being shorted together by deposited HSG polysilicon. Additionally, the process provides a silicon nitride layer which surrounds the storage-node plates and contacts the edges thereof when the silicon nitride cell dielectric layer is subsequently deposited. This feature of the process eliminates the non-uniformity of thickness that accompanies silicon nitride deposition on silicon that is not bounded by silicon nitride.

PREFERRED EMBODIMENT OF THE INVENTION

Figure 1:
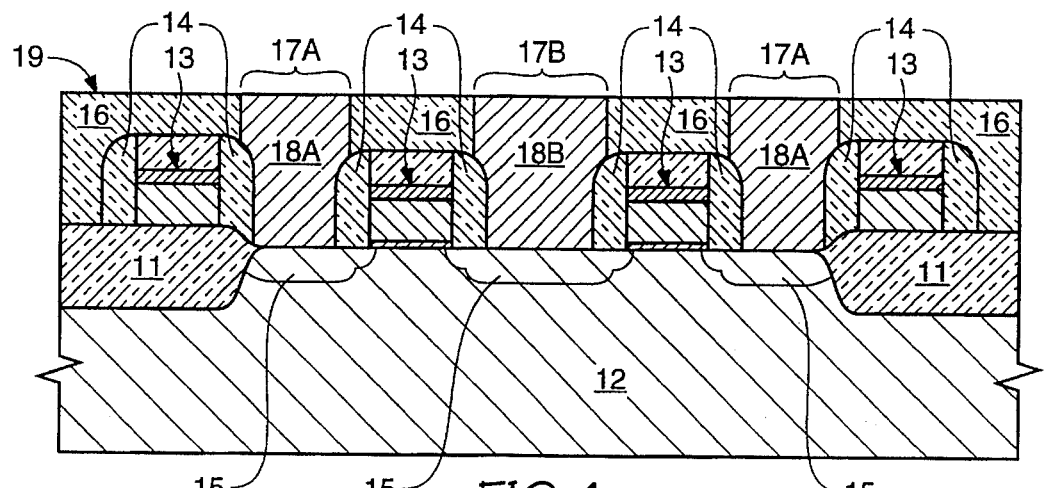
FIG. 1 is a cross-sectional view of a portion of an in-process DRAM array at a stage in the fabrication following field oxide formation, wordline formation, access transistor source/drain region formation, deposition of a planarizing dielectric layer, bitline contact and storage-node contact opening formation, and formation of conductive plugs in both types of contact openings.

Referring now to FIG. 1, the process begins at a point in the DRAM manufacturing sequence that follows formation of field isolation regions 11 on a monocrystalline silicon substrate 12, formation of wordlines 13, formation of spacers 14 on the sidewalls of the wordlines, and formation of source/drain regions 15 for access transistors, the gates of which are provided by the wordlines 13. The process is facilitated by the deposition of a base dielectric layer 16, formation of storage-node contact openings 17A and bitline contact openings 17B in the base dielectric layer 16, and the filling of both types of openings with conductive material to form storage-node contact plugs 18A and bitline contact plugs 18B. Although polysilicon having the same dopant type as the source/drain regions 15 of the cell access transistor is considered to be the preferred material for the contact plugs (18A & 18B), a refractory metal such as tungsten can also be used if a barrier layer is placed between the source/drain regions and the tungsten plugs. A chemical-mechanical polishing (CMP) step is employed to planarize the base dielectric layer so that the tops of the plugs (18A & 18B) are at approximately the same level as the upper surface 19 of the base dielectric layer.

Figure 2:
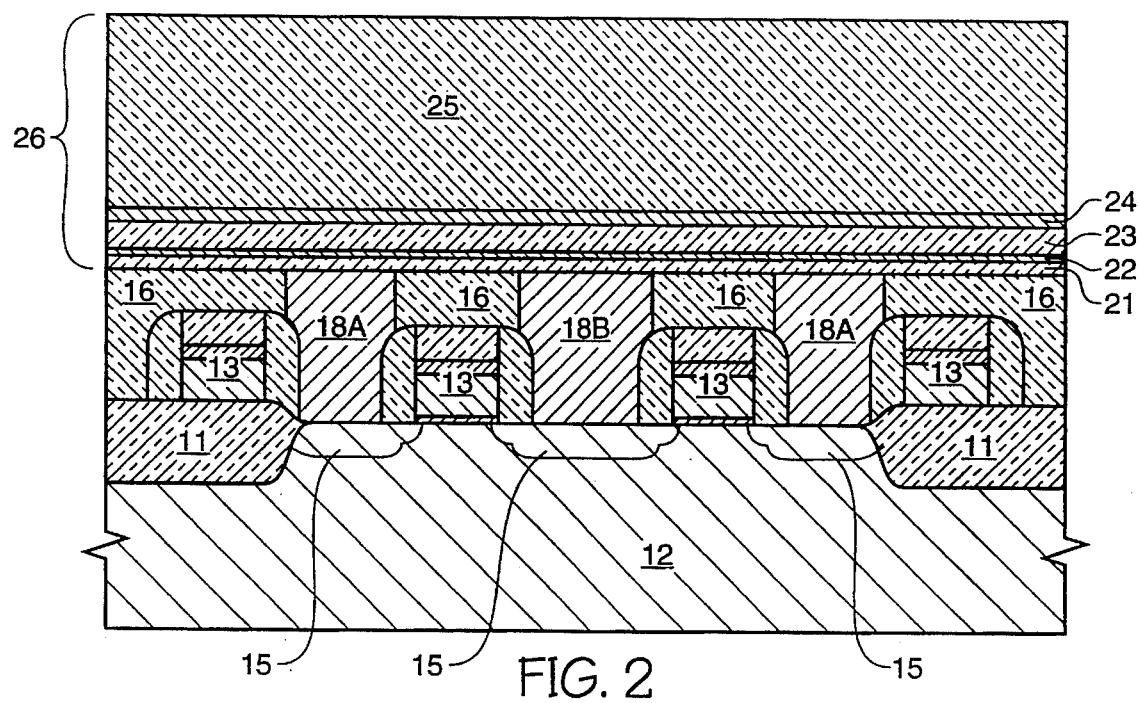
FIG. 2 is a cross-sectional view of the portion of the in-process DRAM array of FIG. 1 following the deposition of a multi-layer partly-sacrificial stack which comprises a first TEOS oxide layer, a first silicon nitride layer, a second TEOS oxide layer, a second silicon nitride layer, and a reflowed boro-phospho-silicate glass (BPSG) layer.

Referring now to FIG. 2, the following layers are deposited in sequence on top of the planarized base dielectric layer 16: a first TEOS silicon dioxide layer 21 (formed by the reaction of a tetraethylorthosilicate precursor compound in a chemical vapor deposition chamber), a first silicon nitride layer 22, a second TEOS silicon dioxide layer 23, a second silicon nitride layer 24, and a borophosphosilicate glass (BPSG) layer 25. The mold layer 25 is reflowed following deposition. The five sequentially-deposited layers form a multi-layer partly-sacrificial stack 26. A "sacrificial" layer is one which is used only during fabrication and which will not be present in the final product. All five layers of the partly-sacrificial stack are most easily deposited using conventional deposition techniques such as chemical vapor deposition (CVD). It should be noted that the first TEOS silicon dioxide layer 21 is an optional layer and serves to reduce stress between the first silicon nitride layer 22 and the base dielectric layer 16, which is generally formed from borophosphosilicate glass that is deposited using chemical vapor deposition. If the first silicon nitride layer 22 is deposited using a low stress process, the first TEOS silicon dioxide layer 21 may be eliminated.

Figure 3:
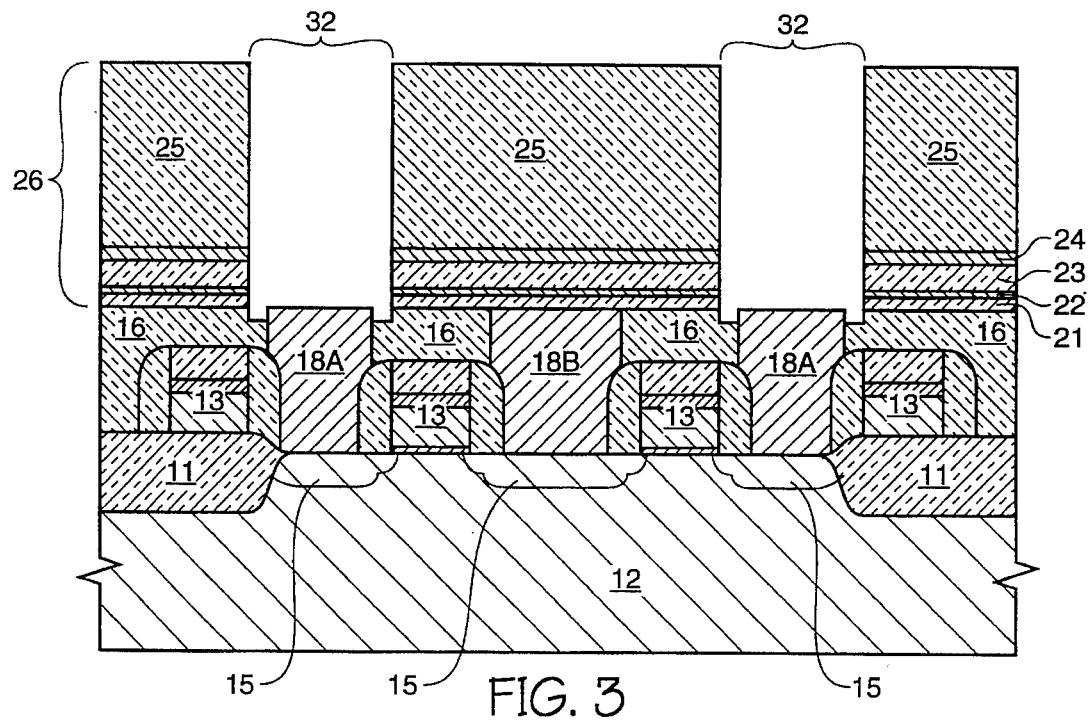
FIG. 3 is a cross-sectional view of the portion of the in-process DRAM array of FIG. 2 following an etch step which forms mold openings in the multi-layer partly-sacrificial stack.

Referring now to FIG. 3, following masking of the mold layer 25 with a photoresist mask 31, mold openings 32 are anisotropically etched in the partly-sacrificial stack 26, exposing the tops of the storage-node contact plugs 18A. A certain amount of over etch is required to take into account process variation and ensure that the tops of plugs 18A are, in fact, exposed throughout the wafer in each wafer lot.

Figure 4:
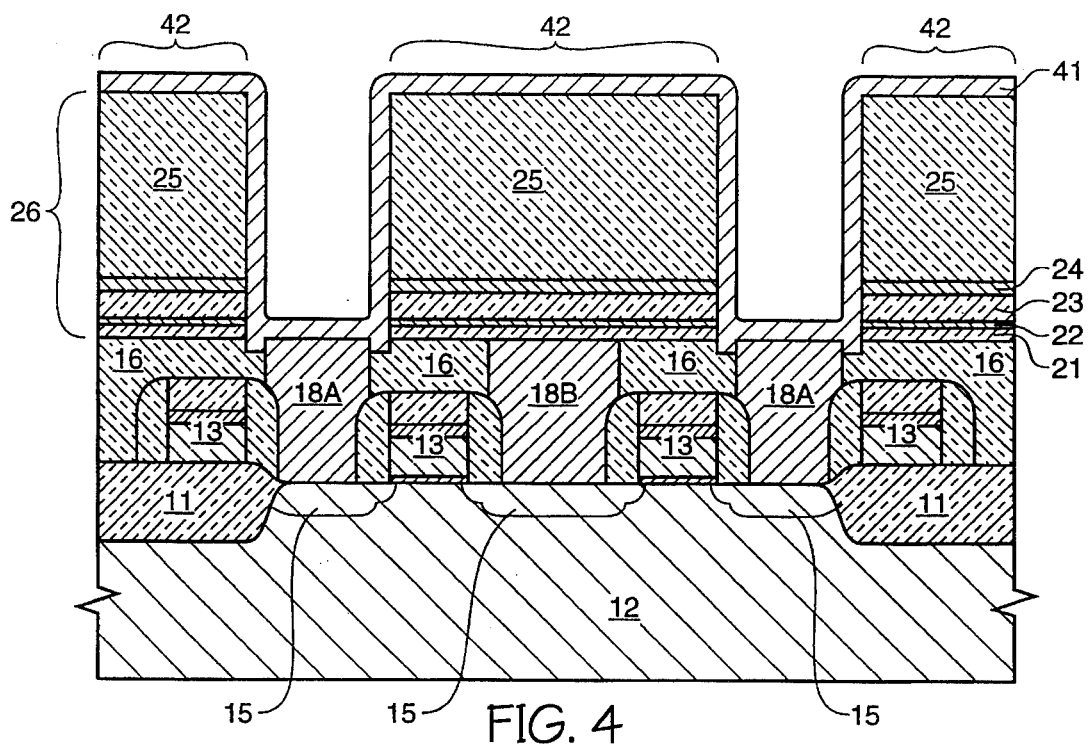
FIG. 4 is a cross-sectional view of the portion of the in-process DRAM array of FIG. 3 following deposition of a storage-node plate layer.

Referring now to FIG. 4, an amorphous silicon storage-node plate layer 41 is deposited. It will be noted that the storage-node plate layer 41 completely lines each mold opening 32 and certain horizontal portions 42 of that layer overlie the upper surface of BPSG layer 25.

Figure 5:
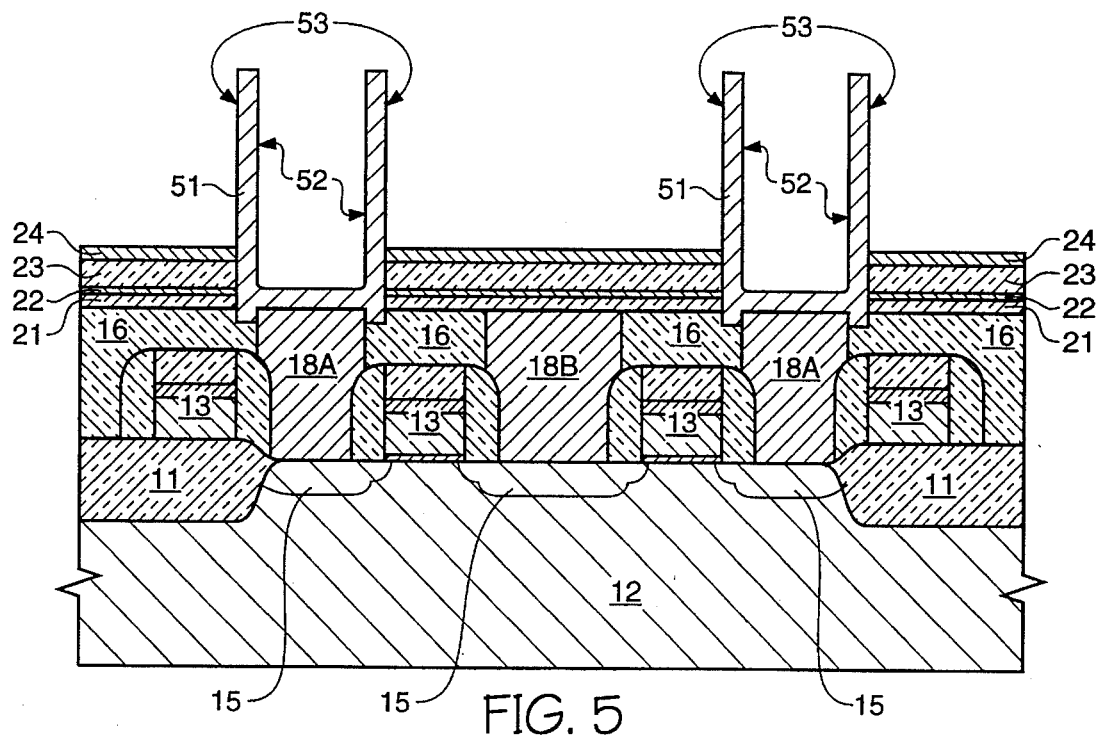
FIG. 5 is a cross-sectional view of the portion of the in-process DRAM array of FIG. 4 following singulation of the individual storage-node plates and removal of the BPSG layer.

Referring now to FIG. 5, the individual storage-node plates 51 are singulated (i.e., separated from one another) by means of a spin-on application of photoresist resin and a subsequent etch back step which removes the horizontal portions 42 of storage-node plate layer 41. Subsequent to the etch back step, BPSG layer 25 is etched away, preferably with a wet etch that is selective for BPSG over silicon. During this wet etch step, the second silicon nitride layer 24 functions as an etch stop layer. The use of an etch stop layer eliminates the danger of overetching. It will be noted that each storage-node plate has an inner surface 52 and an outer surface 53.

Figure 6:
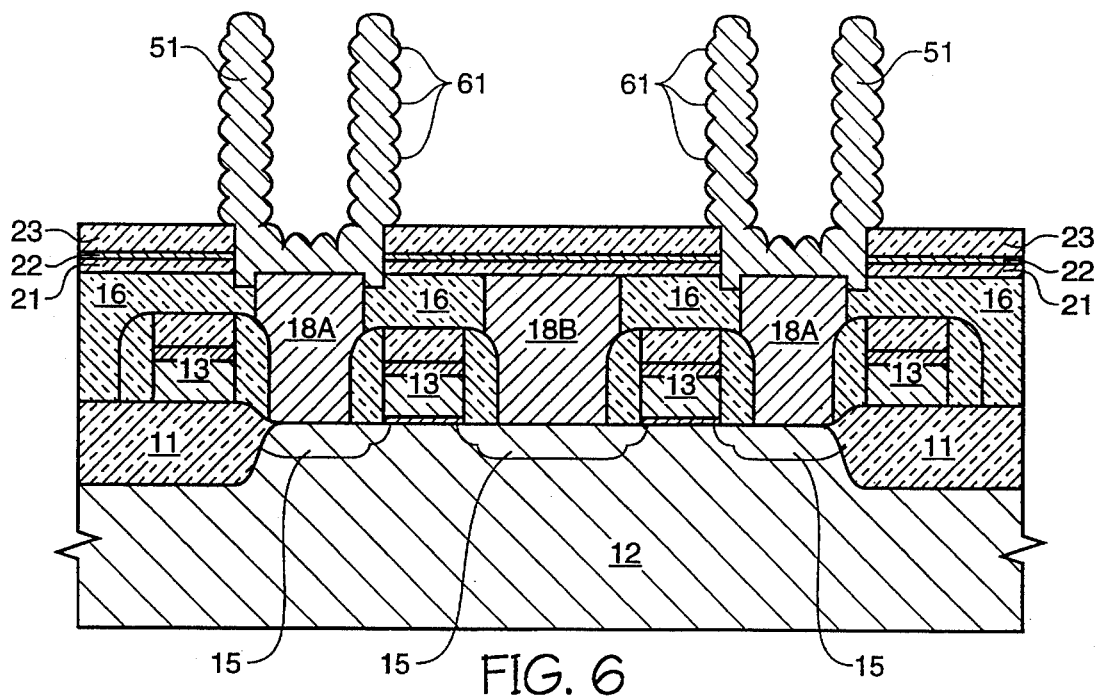
FIG. 6 is a cross-sectional view of the portion of the in-process DRAM array of FIG. 5 following removal of the second silicon nitride layer and growth of hemispherical grain polysilicon asperities on the inner and outer surfaces of the storage-node plates 51.

Referring now to FIG. 6, following the removal of the second silicon nitride layer 24, hemispherical-grain polycrystalline silicon asperities 61 are grown on the inner surfaces 52 and outer surfaces 53 of the amorphous silicon storage-node plates 51 using a seeding or anneal technique, or a combination of both. During the HSG polysilicon growth step, the second TEOS layer 23 permits selective growth of HSG polysilicon on the storage-node plates 51. During the selective growth process, the amorphous silicon of the storage-node plates is converted to polysilicon.

Figure 7:
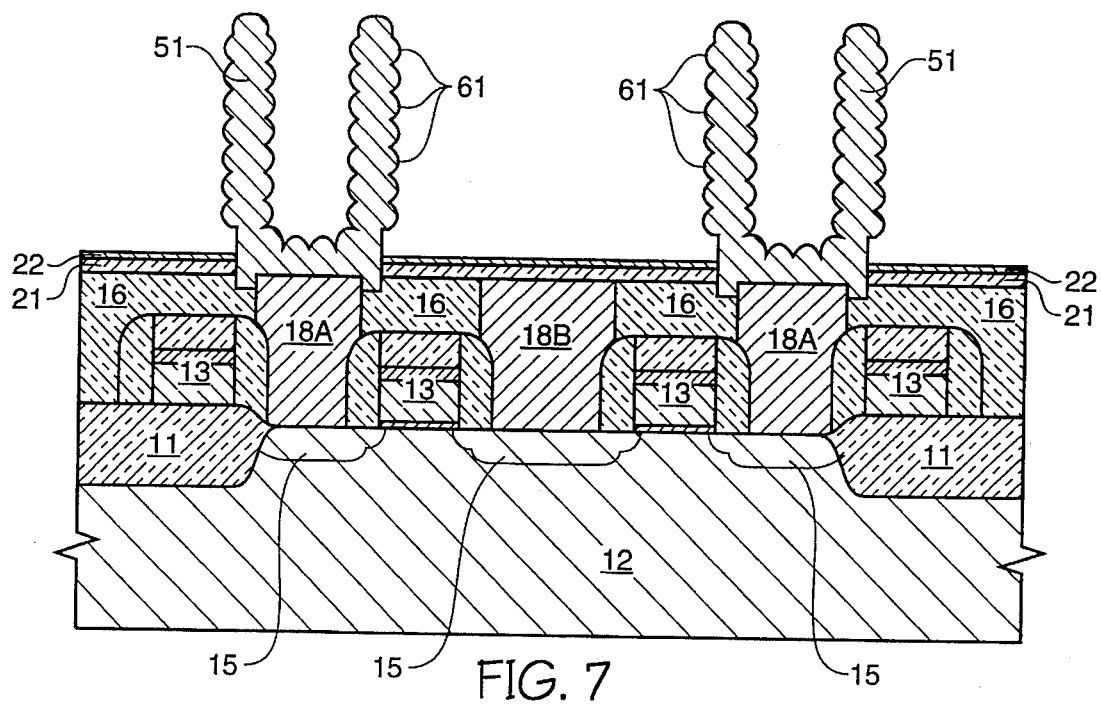
FIG. 7 is a cross-sectional view of the portion of the in-process DRAM array of FIG. 6 following removal of the second TEOS layer with an etch that is selective for TEOS oxide over polycrystalline silicon.

Referring now to FIG. 7, the second TEOS layer 23 has been removed, preferably with a wet etch that is selective for TEOS oxide over polycrystalline silicon. Removal of the second TEOS layer 23 exposes the first silicon nitride layer 22.

Figure 8:
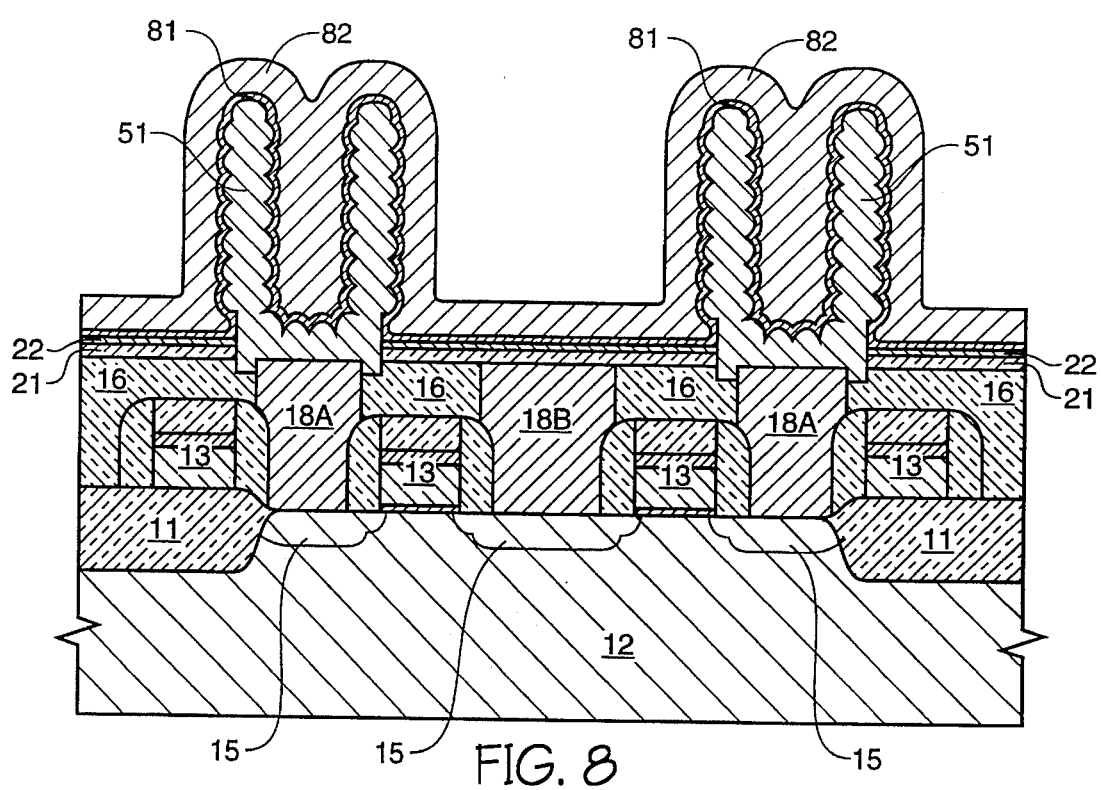
FIG. 8 is a cross-sectional view of the portion of the in-process DRAM array of FIG. 7 following the blanket deposition of a silicon nitride cell dielectric layer and the subsequent deposition of a polysilicon cell plate layer.

Referring now to FIG. 8, a silicon nitride cell dielectric layer 81 is grown or deposited on all exposed surfaces of the array. Thus, the asperity-covered storage-node plates are coated with a silicon nitride layer of appropriate thickness for the voltage at which the memory will be operated. The first silicon nitride layer 22 provides a surface on which the cell dielectric layer 81 can be deposited via chemical vapor deposition. The presence of the first silicon nitride layer 22 at the edges of the storage node plates ensures that a silicon nitride cell dielectric layer 81 having uniform thickness will deposit. For 3-volt parts, the thickness of the cell dielectric layer is generally within a range of 70–100 Å. The cell dielectric layer 81 is then subjected to an oxidizing environment which heals any imperfections in the layer. As it is nearly impossible to completely eliminate native oxide formation on the storage-node plates, the cell dielectric layer is actually a silicon dioxide/silicon nitride/silicon dioxide sandwich, although the sandwich is primarily comprised of silicon nitride. The cell capacitors are completed by depositing a cell plate layer 82. The cell plate layer 82 may be a doped polysilicon layer or it may be some other conductive material that is compatible with the capacitor dielectric layer 81.

Although only a single embodiment of the new process has been disclosed herein, it will be obvious to those having ordinary skill in the art that modification and changes may be made thereto without departing from the spirit and the scope of the process as hereinafter claimed. For example, the second silicon nitride layer 24 may be eliminated from the process if an etch is employed that is selective for BPSG over TEOS silicon dioxide. Thus, the fundamental aspects of the invention are the exposure of a silicon dioxide layer (preferably TEOS oxide) during HSG polysilicon asperity growth and the exposure of a silicon nitride layer during silicon nitride cell dielectric deposition. In the addition, the process may be used for older capacitor designs, such as those having capacitor plates which are not formed in a mold layer. The planarized dielectric layer may also be eliminated, along with the conductive plugs. In such a scenario, a silicon dioxide (preferably TEOS oxide) layer and an underlying silicon nitride layer may be deposited directly over the transistor gates and exposed junctions. Openings are then etched through the silicon dioxide and silicon nitride layers to expose the upper surface of the storage-node junctions. A storage-node plate layer is then deposited, masked and etched (stoping on the TEOS oxide layer). With the TEOS oxide layer exposed, HSG polysilicon growth is initiated. Then the TEOS oxide layer is removed to expose the underlying silicon nitride layer. Finally, a silicon nitride cell dielectric layer is deposited and the capacitor completed by depositing a cell plate layer.

We claim:

1. A method of forming a dynamic random access memory cell capacitor, said method comprising the following steps:
   (a) providing a silicon substrate having a storage-node junction on an upper surface thereof;
   (b) depositing alternating layers of silicon dioxide and silicon nitride superjacent the substrate;
   (c) etching a hole through the alternating layers directly above the storage-node junction;
   (d) forming a storage-node plate from an amorphous silicon layer which is in electrical communication with the storage-node junction through the hole, and which is in contact with at least an edge of each of said alternating layers;
   (e) forming HSG polysilicon asperities on only the storage-node plate while one of said silicon dioxide layers is exposed;
   (f) removing said one of said silicon dioxide layers to expose an underlying silicon nitride layer;
   (g) forming a cell dielectric layer on the asperity-covered storage-node plate; and
   (h) depositing a cell plate layer on top of the cell dielectric layer.

2. The method of claim 1, which further comprises the step of providing a base dielectric layer between the substrate and the alternating layers, the base dielectric layer having a vertically-oriented conductive plug which extends through the base dielectric layer and makes contact with the storage-node junction.

3. The method of claim 2, wherein the base dielectric layer is formed from borophosphosilicate glass.

4. The method of claim 1, wherein etching of the hole through the alternating layers occurs during the following sequence of steps which commence following step (b) of claim 1:
   (a) depositing a mold layer superjacent the alternating layers; and
   (b) forming a depression which penetrates the mold layer and all alternating silicon dioxide and silicon nitride layers.

5. The method of claim 4, wherein the mold layer is formed from borophosphosilicate glass, said mold layer being reflowed after it is deposited.

6. The process of claim 4, wherein the uppermost of said alternating layers is silicon nitride, and formation of the storage-node plate comprises the following sequence of steps:
   (a) depositing an amorphous silicon layer which lines the depression and covers an upper surface of the mold layer;
   (b) removing a portion of the amorphous silicon layer which covers the upper surface of the mold layer, thus forming a singulated storage-node plate; and
   (c) removing the mold layer so as to expose the uppermost of said alternating layers.

7. The method of claim 1 wherein the uppermost of said alternating layers is silicon dioxide.

8. The method of claim 1, wherein the silicon dioxide layers are formed from tetraethylorthosilicate.

9. The method of claim 1, wherein the alternating layers comprise two silicon nitride layers and one silicon dioxide layer.

10. The method of claim 2, wherein the alternating layers comprise two silicon nitride layers and two silicon dioxide layers.

11. The method of claim 10, wherein one of the two silicon dioxide layers functions as a buffer layer between the base dielectric layer and a superjacent silicon nitride layer.

12. The method of claim 1, wherein said cell dielectric comprises silicon nitride.

13. The method of claim 1 wherein said cell dielectric is deposited via chemical vapor deposition.

14. The method of claim 4, wherein said depression is formed with a plasma etch.

15. The method of claim 6, wherein the mold layer is removed with a wet etch.

16. The method of claim 1, wherein the HSG polysilicon asperities are formed on the storage-node plate with a seeding process.

17. The method of claim 1, wherein the HSG polysilicon asperities are formed on the storage-node plate with an annealing process.

18. The method of claim 1, wherein the HSG polysilicon asperities are formed on the storage-node plate via a combination of a seeding process and an anneal process.

19. A method of forming a dynamic random access memory cell capacitor comprising the following steps:
   (a) providing a base dielectric layer through which a vertically oriented polysilicon plug makes contact to a subjacent storage-node junction of a memory cell access device;
   (b) depositing a first silicon nitride layer superjacent the base dielectric layer;
   (c) depositing a silicon dioxide layer on top of the first silicon nitride layer;

(d) depositing a second silicon nitride layer on top of the silicon dioxide layer;

(e) depositing a mold layer on top of the second silicon nitride layer;

(f) forming a depression in the mold layer and all intervening layers between the mold layer and the base dielectric layer, such that said depression exposes at least an upper surface of the polysilicon plug;

(g) depositing an amorphous silicon layer which lines the depression, which is in direct contact with said polysilicon plug, and which covers an upper surface of the mold layer;

(h) removing a portion of the amorphous silicon layer which covers the upper surface of the mold layer, thus forming a singulated storage-node plate;

(i) removing the mold layer so as to expose the second silicon nitride layer;

(j) removing the second silicon nitride layer to expose the silicon dioxide layer;

(k) forming HSG polysilicon asperities on only the storage-node plate;

(l) removing the silicon dioxide layer so as to expose the first silicon nitride layer;

(m) depositing a cell dielectric layer on the asperity-covered storage-node plate; and (n) depositing a cell plate layer on top of the cell dielectric layer.

20. The method of claim 19, wherein the base dielectric layer and the mold layer are both formed from borophosphosilicate glass.

21. The process of claim 19, which further comprises the step of depositing a buffer layer between the base dielectric layer and the first silicon nitride layer.

22. The process of claim 19, wherein said silicon dioxide layer and said buffer layer are formed from tetraethylorthosilicate.

23. The method of claim 19, wherein said depression is formed with a plasma etch.

24. The method of claim 19, wherein the mold layer is removed with a wet etch.

25. The method of claim 19, wherein the HSG polysilicon asperities are formed on the storage-node plate via an seeding process.

26. The method of claim 19, wherein the HSG polysilicon asperities are formed on the storage-node plate via a seeding process.

27. The method of claim 19, wherein the HSG polysilicon asperities are formed on the storage-node plate via a combination of a seeding process and an anneal process.

28. The method of claim 19, wherein the deposited silicon layer is amorphous silicon.

29. The method of claim 19, wherein the cell dielectric layer comprises silicon nitride.

* * * * *